(12) United States Patent
Chakraborti et al.

(10) Patent No.: US 7,886,242 B1
(45) Date of Patent: Feb. 8, 2011

(54) SYSTEMS, METHODS, AND APPARATUS FOR TOTAL COVERAGE ANALYSIS AND RANKING OF CIRCUIT DESIGNS

(75) Inventors: Swapnajit Chakraborti, Noida (IN); Sandeep Pagey, New Delhi (IN); Boris Gommershtadt, Jerusalem (IL); Yael Duek-Golan, Jerusalem (IL)

(73) Assignee: Cadence Design Systems, Inc., San Jose, CA (US)

( * ) Notice: Subject to any disclaimer, the term of this patent is extended or adjusted under 35 U.S.C. 154(b) by 439 days.

(21) Appl. No.: 11/842,820

(22) Filed: Aug. 21, 2007

Related U.S. Application Data

(60) Provisional application No. 60/869,722, filed on Dec. 12, 2006.

(51) Int. Cl.
*G06F 17/50* (2006.01)

(52) U.S. Cl. .......................................................... 716/5

(58) Field of Classification Search ..................... 716/1, 716/5
See application file for complete search history.

(56) References Cited

U.S. PATENT DOCUMENTS

| | | | | |
|---|---|---|---|---|
| 5,604,895 | A * | 2/1997 | Raimi | 703/13 |
| 6,990,438 | B1 * | 1/2006 | Chowdhury et al. | 703/13 |
| 2003/0188224 | A1 * | 10/2003 | Decker | 714/25 |
| 2003/0229889 | A1 * | 12/2003 | Kuzmin et al. | 717/130 |
| 2004/0216023 | A1 * | 10/2004 | Maoz et al. | 714/742 |
| 2004/0255275 | A1 * | 12/2004 | Czerwonka | 717/124 |
| 2005/0278576 | A1 * | 12/2005 | Hekmatpour | 714/37 |
| 2006/0048026 | A1 * | 3/2006 | Fine et al. | 714/724 |
| 2006/0107141 | A1 * | 5/2006 | Hekmatpour | 714/724 |
| 2008/0307263 | A1 * | 12/2008 | Coulter et al. | 714/37 |
| 2010/0070940 | A1 * | 3/2010 | Bist et al. | 716/5 |

* cited by examiner

*Primary Examiner*—Jack Chiang
*Assistant Examiner*—Suchin Parihar
(74) *Attorney, Agent, or Firm*—Alford Law Group, Inc.; William E. Alford

(57) ABSTRACT

In some embodiments of the invention, a method and apparatus of consolidating all types of coverage metrics, obtained from an HDL simulator, under a single common framework is described. In other embodiments of the invention, a method and an apparatus are disclosed for performing ranking from a verification plan using total coverage metric.

16 Claims, 20 Drawing Sheets

```
section top {
...
section I {
    coverage "block" {...};
    coverage "expression" {...};
    coverage "state" {...};
    coverage "transition" {...};
    section control {
        coverage "PSL1" {...};
        coverage "PSL2" {...};
        coverage "SVA1" {...};
    }
    section data {
        section cginst1 {
            coverage "CP1" {...};
            coverage "CP2" {...};
            coverage "CP3" {...};
        }
        section cginst2 {
            coverage "CP4" {...};
            coverage "CP5" {...};
            coverage "CP6" {...};
        }
    }
}
...
}
```

```
section MI {
    coverage "block" {...};
    coverage "expression" {...};
    coverage "state" {...};
    coverage "transition" {...};
    section control {
        coverage "PSL1" {...};
        coverage "PSL2" {...};
        coverage "SVA1" {...};
    }
    section data {
        section cginst1 {
            coverage "CP1" {...};
            coverage "CP2" {...};
            coverage "CP3" {...};
        }
        section cginst2 {
            coverage "CP4" {...};
            coverage "CP5" {...};
            coverage "CP6" {...};

SYSTEMS, METHODS, AND APPARATUS FOR TOTAL COVERAGE ANALYSIS AND RANKING OF CIRCUIT DESIGNS

CROSS REFERENCE TO RELATED APPLICATIONS

The instant application claims priority under 35 U.S.C. §119 to commonly assigned U.S. Provisional Patent Application Ser. No. 60/869,722, filed on Dec. 12, 2006, titled Methods and Apparatus for Total Coverage Analysis and Ranking of Circuit Designs, which is expressly incorporated herein in its entirety by this reference.

FIELD

The embodiments of the invention relate generally to functional verification of circuit designs. More particularly, the embodiments of the invention relate to coverage driven verification of integrated circuit designs.

BACKGROUND

Current integrated circuit designs may be very complex and expensive to manufacture. Thus, it is important that the functional design of an integrated circuit is verified prior to manufacturing.

BRIEF SUMMARY

The embodiments of the invention are summarized by the claims that follow below.

BRIEF DESCRIPTIONS OF THE DRAWINGS

FIG. 1A is an exemplary verification plan for a design instance for total coverage.

FIG. 1B is an exemplary verification plan of a design module for total coverage representation.

DETAILED DESCRIPTION

Figure 2:
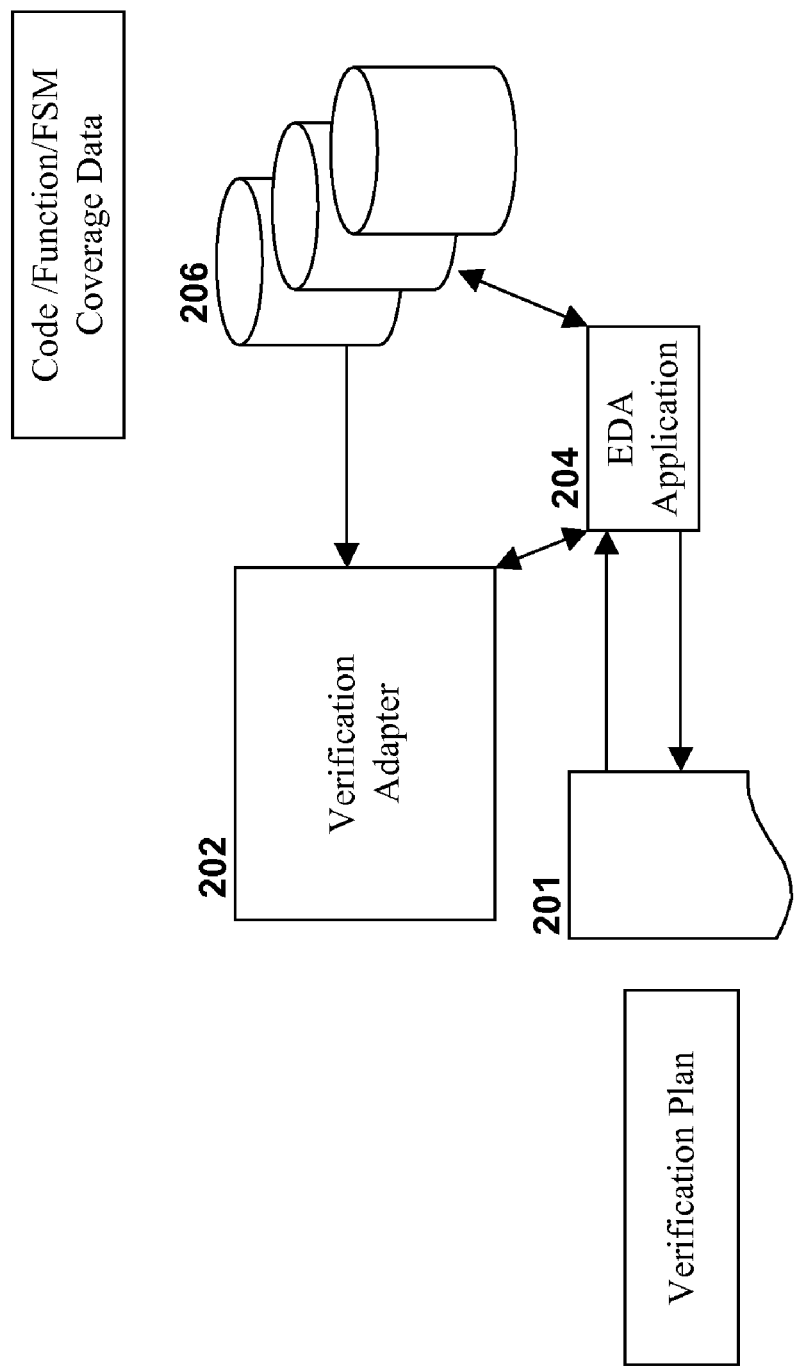
FIG. 2 is a block diagram illustrating elements of an exemplary verification system to annotate coverage to a verification plan.

In the following detailed description of the embodiments of the invention, numerous specific details are set forth in order to provide a thorough understanding of the present invention. However, it will be obvious to one skilled in the art that the embodiments of the invention may be practiced without these specific details. In other instances well known methods, procedures, components, and circuits have not been described in detail so as not to unnecessarily obscure aspects of the embodiments of the invention.

Introduction

Coverage Driven Verification (CDV) is used by verification engineers to measure progress and completeness of verification of a circuit design. Since verification of complex system on chips (SOCs) has become enormously time-consuming and difficult to manage, verification engineers are gradually shifting towards a plan-based CDV methodology. The plan in this methodology refers to a verification plan used for tracking coverage obtained from various aspects of a design. Once all the coverage goals in the verification plan have been met, verification is said to have reached completion. Coverage metrics are broadly classified into three types, namely, code coverage, functional coverage and finite-state-machine (FSM) coverage. Code coverage provides information on the coverage of the register transfer level (RTL) code of implementation of the blocks. This includes block/line coverage, statement coverage, expression coverage and toggle coverage. Functional coverage, on the other hand provides information on coverage of the functionality of the design. This includes assertion/sequence coverage and coverage reported by SystemVerilog and "e" covergroups. FSM coverage, as the name suggests, provides coverage information regarding the state/transition coverage of the FSMs that are present in the design.

All these coverage metrics are used while making an informed decision about the completeness of verification. In order to achieve that, all these coverage metrics are captured against the verification plan and presented to the verification engineer/manager so that decision making on progress of verification is easy and effective.

A verification engineer, after generating all types of coverage metrics using various verification tools (such as hardware description language (HDL) simulators), typically takes some kind of an ad-hoc approach for accumulating all the coverage information together. The coverage data is generated for a large number of tests, on the order of thousands. The task of collecting all types of coverage metrics from a large number of tests and then making a decision based on overall coverage, including code, functional and finite state machine (FSM) coverage, is a daunting task in itself. A method or technique that automatically enables this process of accumulation of coverage data and generates total coverage information (based on code, functional, and FSM coverage) will be useful for the plan-based CDV verification. It is desirable that substantially all coverage metrics be captured in a single framework and presented to the verification engineer/manager.

Another level of complexity, which happens during the analysis phase of the verification, is that all these tests are ranked or ordered so that redundant tests can be pruned out and a maximum total coverage of the design is achieved by running a minimal number of tests.

Typically verification tools offer ranking based on only one type of coverage. This means if a verification engineer wants to rank the tests based on combination of code, functional and FSM coverage, there is no way to do this. But true ranking of tests should consider total coverage instead of a specific coverage metric. In this scenario, if the verification engineer wants to obtain ranking based on total coverage, he/she will have to generate the ranking based on a particular coverage metric e.g. code coverage first. Once rankings for code, functional and FSM coverage are generated separately, the verification engineer may do some heuristic-based approach to determine the ranking based on overall or total coverage. So it is obvious that a method and apparatus for performing ranking of tests based on overall coverage metric will also be very useful for verification engineers. A user may need to perform ranking based on either the total coverage of the entire design under verification (DUV), a sub-hierarchy of the DUV, or an arbitrary combination of coverage from the design. It is desirable to provide these capabilities supporting a ranking using total coverage.

Herein methods and apparatus are described to address issues prevailing in the plan-based CDV domain.

Plan-Based Coverage Driven Verification (CDV)

The embodiments of the invention include a method, apparatus and system for coverage driven verification of the functionality of an integrated circuit design.

In a Coverage Driven Verification (CDV) methodology, progress and completeness of verification is measured using a number of coverage metrics associated with the device under test (DUT) or the design under verification (DUV). Three primary coverage metrics used by verification engineers are code coverage, functional coverage and FSM coverage. A tool, for instance, an HDL simulator, generates the data regarding coverage achieved for the coverage metrics. While code coverage metrics and FSM coverage metrics are derived from the HDL implementation, the functional coverage points have to be written explicitly by the user, in addition to the HDL implementation. The HDL implementation is usually done in Verilog, very high speed integrated circuit (VHSIC) HDL (VHDL) and/or a mix of both.

Functional coverage points can be specified using property specification language (PSL), SystemVerilog Assertions (SVA), SystemVerilog covergroups and "e" language constructs. A challenge faced by the verification community is to capture all types of coverage metrics from verification tools inside a common framework and analyze the progress of verification based on overall coverage (also referred to as total coverage), which combines all types of coverage metrics. Embodiments of the invention address this challenge in the CDV methodology flow of circuit design. Methods and apparatus to improve CDV methodology flow of circuit design are described in the paragraphs that follow below.

In some embodiments of the invention, a method and apparatus of consolidating all types of coverage metrics, obtained from an HDL simulator, under a single common framework is disclosed. The common framework referred here is a verification plan derived from a functional specification of the DUV and captures the design blocks/hierarchy and their associated coverage models. Coverage grades/figures of each of the design blocks/hierarchy captured in the verification plan, is obtained from the verification tool e.g. HDL simulator and annotated to the corresponding items in the verification plan with the help of an internal agent layer. This enables the verification engineer/manager to capture information pertaining to all types of coverage from the simulator, in the verification plan. The coverage grades are presented for a user-selected subset of simulation-based verification runs performed on the DUV.

Another user desired function of a CDV methodology, is to rank or order a set of tests based on coverage metrics such that maximal total coverage is achieved using optimal subset of tests. This is also useful for pruning redundant tests from a test suite. For this reason, once total coverage is available in a verification plan, ranking must also be supported on the total coverage. In other embodiments of the invention, ranking of tests based on combination of all types of coverage metrics, namely, code, functional and FSM coverage are disclosed. In embodiments of the invention, a method and an apparatus are disclosed for performing ranking from a verification plan using total coverage metric. This ranking technique, as described herein, allows users to rank tests based on total coverage at various levels of granularity. For example, ranking can be done using the complete DUV. In this case, all coverage metrics, which have been collected from the DUV from various tests, are used for ranking the tests. So the ranking method uses total coverage metric of the DUV for ranking. Ranking may also be performed after selecting any sub-hierarchy of the DUV from the verification plan. In this case, the ranking is performed only considering the coverage figures for the selected sub-hierarchy. Another level of granularity, supported by this ranking method, is that user can rank the tests based on a specific functional coverage point, specified using PSL, SVA, SystemVerilog covergroup or "e". In this case, the ranking method uses only selected functional coverage point for ranking the set of tests. The verification plan may also contain a user defined combination of coverage points from across the design and ranking may also be performed on this user defined combination in another embodiment of the invention. Hence the ranking method determines which coverage metrics can be used, based on the granularity selected by the user from the verification plan.

Plan-based CDV starts with the verification plan created by the verification team based on the functional specification of the DUV. Verification plan syntax, supported by an existing EDA application, enables specification and collection of only testbench coverage data for coverage model specified using a Hardware Verification Language (HVL) called "e". But verification completeness cannot be measured just by considering testbench coverage. In order to make correct decision regarding the completeness of verification, all types of coverage data, namely code, functional and FSM coverage collected from the DUV is necessary. Once all types of coverage data is collected and annotated to the verification plan, along with testbench coverage data, verification completeness can be measured based on total coverage.

The embodiments of the invention, provide an extension of existing verification plan syntax, supported by an electronic design automation (EDA) application, to enable specification of all types of coverage namely, code, functional and FSM coverage in the verification plan. Methods to annotate all types of coverage data to the verification plan and perform ordering/ranking of tests based on all coverage types annotated to the verification plan are disclosed.

Figure 8:
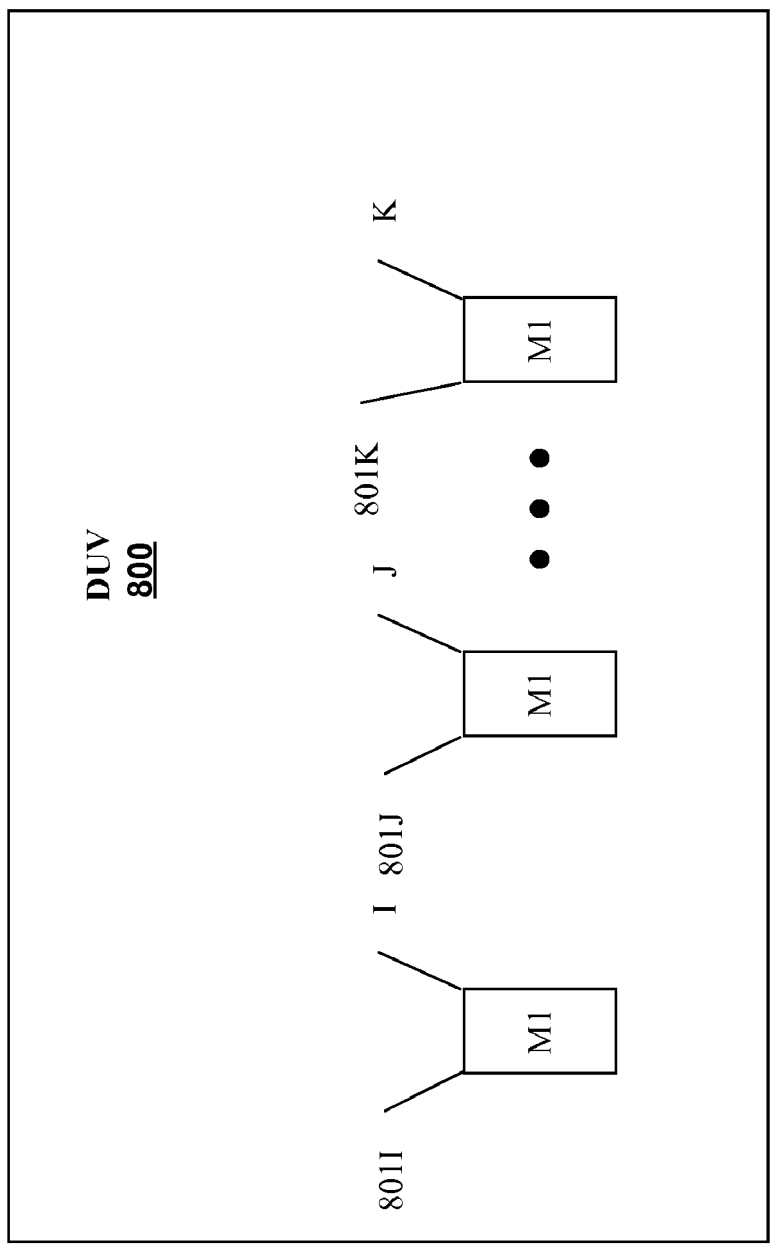
FIG. 8 is a block diagram of an exemplary integrated circuit design under verification (DUV).

Referring now to FIGS. 1A-1B and 8, a new format of a verification plan that captures all types (code, functional, FSM) of coverage data generated from DUV by verification tools such as an HDL simulator is illustrated. This verification plan contains a section for each of the instance/module of the design. FIG. 8 illustrates an integrated circuit DUV 800. The DUV 800 includes instances I-K 8011-801K of a module M1. The module M1 includes electronic circuitry to perform some function, typically a logical function.

If code coverage (block/expression) is enabled for an instance/module, a corresponding section in the verification plan will contain coverage items for enabled code coverage types for that instance/module. For example, if only "block" coverage is enabled for an instance/module, a corresponding section in the verification plan will contain an item for "block" coverage. Similarly, if "expression" coverage is enabled for an instance/module, a corresponding section in verification plan will contain an item for "expression" coverage. If both "block" and "expression" coverage are enabled for an instance/module, a corresponding section in verification plan will contain items for both "block" and "expression" coverage.

If FSM coverage is enabled for an instance/module, a corresponding section will contain two items, one for "state" coverage and one for "transition" coverage.

Functional coverage is enabled for an instance/module if it contains either some PSL/SVA assert/cover/assume directives or SystemVerilog covergroup instances. Functional coverage of PSL/SVA assert/assume/cover directives are called "control-oriented" functional coverage. Functional coverage for SystemVerilog covergroups are called "data-oriented" functional coverage.

If the instance/module contains PSL/SVA assert/assume/cover directives, a sub-section named "control" is generated in the verification plan inside the section corresponding to the instance/module. This sub-section, will contain item for each of the PSL/SVA assert/assume/cover directives.

If the instance/module contains SystemVerilog covergroup instances, a sub-section named "data" is generated in the section for that instance/module. Inside this sub-section, for each covergroup instance, one sub-section having the name of the covergroup instance, is generated. Within this sub-section corresponding to each covergroup instance, one item is generated for each of the coverpoints in that covergroup instance.

A snippet of the verification plan is shown in FIGS. 1A and 1B, that shows all the coverage items, which are described above, inside the section of an instance "I" and a module "M1". The verification plan can either be written by a verification engineer or it can be generated automatically.

Once a verification engineer creates a verification plan using all types of coverage as shown in FIGS. 1A and 1B, relevant coverage data needs to be annotated to the plan to enable decision making based on overall or total coverage including code, functional and FSM coverage. The method for collecting and annotating total coverage data is explained with reference to FIG. 2 and FIG. 9. While annotating coverage data to a section corresponding to a module, coverage data are accumulated from all its instances.

FIG. 2 illustrates a verification system 200. The verification system 200, coupled together as shown, includes a verification plan 201, a verification adapter (also referred to as the "Adapter") 202, an electronic design automation (EDA) application 204, and a plurality of coverage databases 206 stored on one or more storage disks and files.

Figure 9:
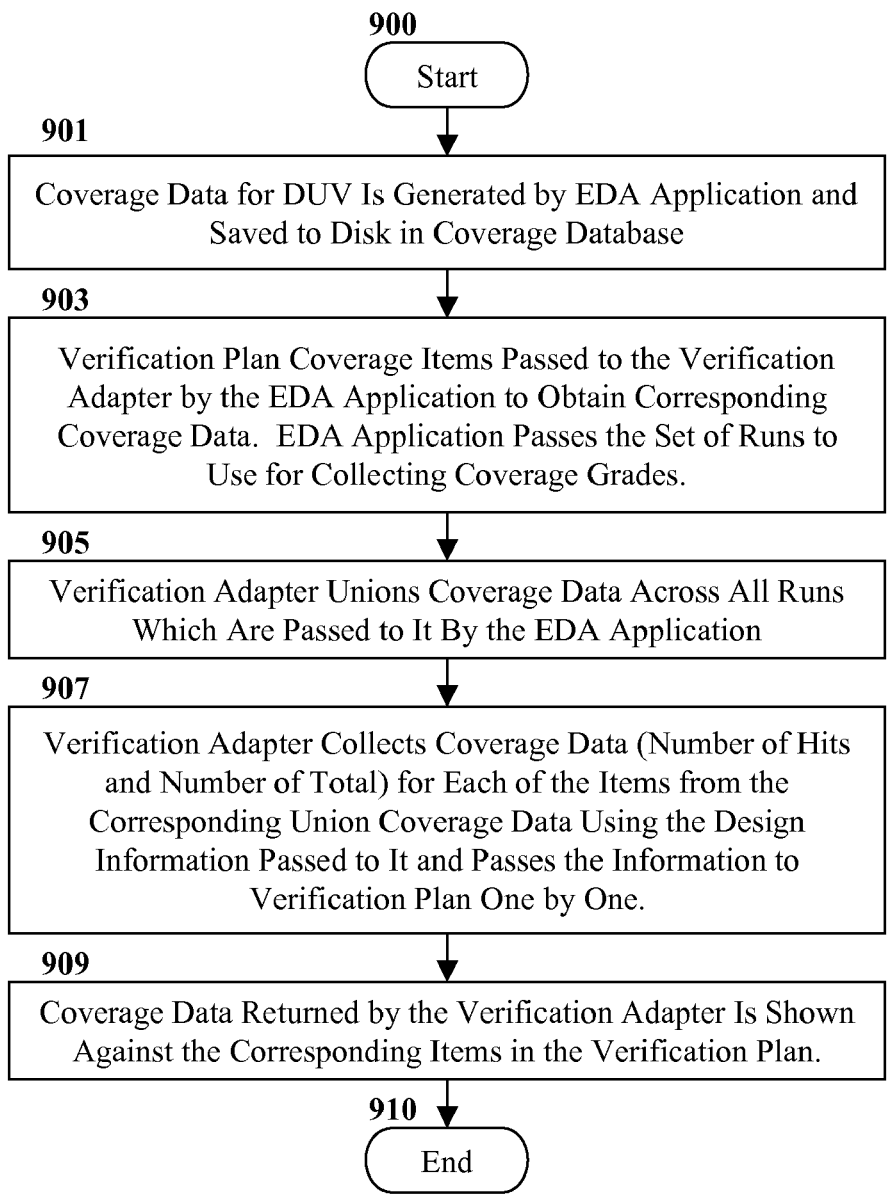
FIG. 9 illustrates a flow chart of a method for collecting and annotating total coverage data.

Referring now to FIGS. 2 and 9, the method for collecting and annotating total coverage data starts at 900 and proceeds as follows:

At process 901, coverage data, namely, code, functional, FSM coverage for a DUV is generated by an EDA application on disk. For multiple test runs of the DUV, multiple coverage databases are created.

At process 903, verification plan coverage items (as shown in FIGS. 1A-B), are passed to the "Adapter" 202 by the EDA application 204, to obtain corresponding coverage data 206. Each item also contains the necessary design information with it. For example, each "block" item will also have the instance/module information passed with it. The EDA application 204 also passes the set of runs that should be used for collecting coverage grades for these items.

At process 905, the "Adapter" 202 does a union of coverage data across all runs that are passed to it by the EDA application 204. The union is done separately for each coverage type, namely, code, functional and FSM coverage data.

At process 907, the "Adapter" 202 collects coverage data (number of hits and number of total) for each of the items from the corresponding union coverage data using the design information passed to it, and passes the information to the EDA application 204 one by one. For example, for the "block" item, the Adapter 202 collects the number of hits and total from corresponding design instance/module and passes that to the EDA application 204.

At process 909, the coverage data returned by the "Adapter" 202 is shown against the corresponding items in the verification plan 201.

Once coverage data is obtained for all coverage types and shown against corresponding items in the verification plan 201, verification completeness can be inferred based on total coverage. With the verification plan 201 showing the coverage items for code, functional and FSM coverage, ranking of tests can be based on these items. In a typical flow, a user may either select a single item e.g. "block" or "PSL1" (see FIG. 1A) or a section hierarchy, e.g. section "I" (see FIG. 1A) and initiate ranking. When user selects a section hierarchy, such as section "I" for example, the EDA application 204 converts it to a set of items that includes all the coverage items included in that section hierarchy. So, in case section "I" is selected, all coverage items, namely, "block", "expression", "state", "transition", "PSL1", "PSL2", "SVA1", "CP1", "CP2", "CP3", "CP4", "CP5" and "CP6" are selected. So, in this case, ranking of the set of tests should be based on all these coverage items representing all coverage types.

Ranking or ordering of tests, based on test-bench coverage items, may be supported by the EDA application that supports verification plan-based CDV methodology. By ranking a set of tests, a user can select an optimal subset known as "best set of tests" which provides maximum coverage. In this process, the redundant tests are also identified. A method is described herein in which the EDA application can apply and perform ranking based on code, functional and FSM coverage items obtained from the DUV 800 as shown in FIG. 8.

The EDA application 204 does ranking of tests based on "ranking score" which is calculated for each test with respect to the "best set of tests". Based on the "ranking score", the EDA application 204 decides whether to add a test to the "best set of tests" or mark it as redundant. This process continues until all the tests are considered. Finally, the "best set of tests" contains the ranked subset of tests. The redundant tests are not included in the "best set of tests". Note that "best set of tests" is empty when ranking process is initiated. In order to calculate the "ranking score" of a test, the EDA application 204 requires the coverage grade increment for each coverage item which is selected for ranking.

In the following paragraphs, a description of a sequence of steps performed by a verification adapter 202 (also referred to herein as the "Adapter") shown in FIG. 2, to calculate the coverage grade increment per item. The "Adapter" 202 is invoked by the EDA application 204, for each test T remaining to be ranked, for calculation of coverage grade increments for each item in the set of coverage items selected for ranking.

For ease of explanation, the following notation is used to explain the method:

$B_S$=Best set of tests (containing code, functional and FSM coverage data for best set)

T=Test for which ranking score is calculated $U_S$=Union of $B_S$ and T (containing code, functional and FSM coverage data after union)

$I_B$="block" coverage item $I_F$, ="expression" coverage item $I_S$="state" coverage item $I_T$="transition" coverage item $I_C$=Coverage item corresponding to a PSL/SVA assert/assume/cover directive $I_D$=Coverage item corresponding to a SystemVerilog coverpoint $C_G(I, T)$=Coverage Grade or number of hits of item I based on coverage data of test T Referring now to FIGS. 10A-10H, a method for calculation of coverage grade increment for a set of coverage items for a single test T begins at 1000 and is now described.

At process 1001, the "Adapter" does a union of the code coverage data from test T and the code coverage data from $B_S$ and stores the result in U.

At process 1002, the "Adapter" does a union of the functional coverage data from test T and the functional coverage data from $B_S$ and stores the result in U.

At process 1003, the "Adapter" does a union of the FSM coverage data from test T and FSM coverage data from $B_S$ and stores the result in U.

At process 1004, a determination is made if a coverage item is a "block" or not. If the coverage item is "block", the "Adapter" executes the following steps starting with reference 1040 in FIG. 10C. If the item is not a block, then the process goes to process 1005.

At process 1041, the "Adapter" collects coverage grade (number of hits) for $I_B$, from code coverage data stored in B. This is denoted as $C_G(I_B, B_S)$ and may be referred to as best test set block coverage grade.

At process 1042, the "Adapter" collects coverage grade (number of hits) for $I_B$, from code coverage data stored in U. This is denoted as $C_G(I_B, U_S)$ and may be referred to as joint block coverage grade.

At process 1043, the "Adapter" computes the block coverage grade increment by determining the difference between the joint block coverage grade and the best test set block coverage grade, i.e., $C_G(I_B, U_S)-C_G(I_B, B_S)$.

At process 1044, the block coverage grade increment is passed to the EDA application. The process then returns to reference number 1020 illustrated in FIG. 10A and proceeds to element 1010.

At process 1005, a determination is made if the coverage item is an "expression" or not. If the coverage item is an "expression", the "Adapter" executes the following steps starting with reference 1050 in FIG. 10D. If the item is not an expression, then the process goes to process 1006.

At process 1051, the "Adapter" collects coverage grade (number of hits) for $I_E$, from code coverage data stored in B. This is denoted as $C_G(I_E, B_S)$ and my be referred to as best test set expression coverage grade.

At process 1052, the "Adapter" collects coverage grade (number of hits) for $I_E$, from code coverage data stored in $U_S$. This is denoted as $C_G(I_E, U_S)$ and may be referred to as joint expression coverage grade.

At process 1053, the "Adapter" computes the expression coverage grade increment by determining the difference between the joint expression coverage grade and the best test set expression coverage grade, i.e., $C_G(I_E, U_S)-C_G(I_E, B_S)$.

At process 1054, the expression coverage grade increment is passed to the EDA application. The process then returns to reference number 1020 illustrated in FIG. 10A and proceeds to element 1010.

At process 1006, a determination is made if the coverage item is a PSL/SVA assert/assume/cover directive or not. If the coverage item is a PSL/SVA assert/assume/cover directive, the "Adapter" executes the following steps starting with reference 1060 in FIG. 10E. If the item is not a PSL/SVA assert/assume/cover directive, then the process goes to process 1007.

At process 1061, the "Adapter" collects coverage grade (number of hits) for $I_C$, from functional coverage data stored in B. This is denoted as $C_G(I_C, B_S)$ and may be referred to as best test set control-oriented functional coverage grade.

At process 1062, the "Adapter" collects coverage grade (number of hits) for $I_C$, from functional coverage data stored in U. This is denoted as $C_G(I_C, U_S)$ and may be referred to as joint control-oriented functional coverage grade.

At process 1063, the "Adapter" computes the control-oriented functional coverage grade increment by determining the difference between the joint control-oriented functional coverage grade and the best test set control-oriented functional coverage grade, i.e., $C_G(I_C, U_S)-C_G(I_C, B_S)$.

At process 1064, the coverage grade increment is passed to the EDA application. The process then returns to reference number 1020 illustrated in FIG. 10A and proceeds to element 1010.

At process 1007, a determination is made if the coverage item is a SystemVerilog coverpoint or not. If the coverage item is a SystemVerilog coverpoint, the "Adapter" executes the following steps starting with reference 1070 in FIG. 10F. If the item is not a SystemVerilog coverpoint, then the process goes to process 1008.

At process 1071, the "Adapter" collects coverage grade (number of hits) for $I_D$, from functional coverage data stored in $B_S$. This is denoted as $C_G(I_D, B_S)$ and may be referred to as best test set data-oriented functional coverage grade.

At process 1072, the "Adapter" collects coverage grade (number of hits) for $I_D$, from data-oriented functional coverage data stored in $U_S$. This is denoted as $C_G(I_D, U_S)$ and may be referred to as joint data-oriented functional coverage grade.

At process 1073, the "Adapter" computes the data-oriented functional coverage grade increment by determining the difference between the joint data-oriented functional coverage grade and the best test set data-oriented functional coverage grade, i.e., $C_G(I_D, U_S)-C_G(I_D, B_S)$.

At process 1074, the coverage grade increment is passed to the EDA application. The process then returns to reference number 1020 illustrated in FIG. 10A and proceeds to element 1010.

Figure 10A:
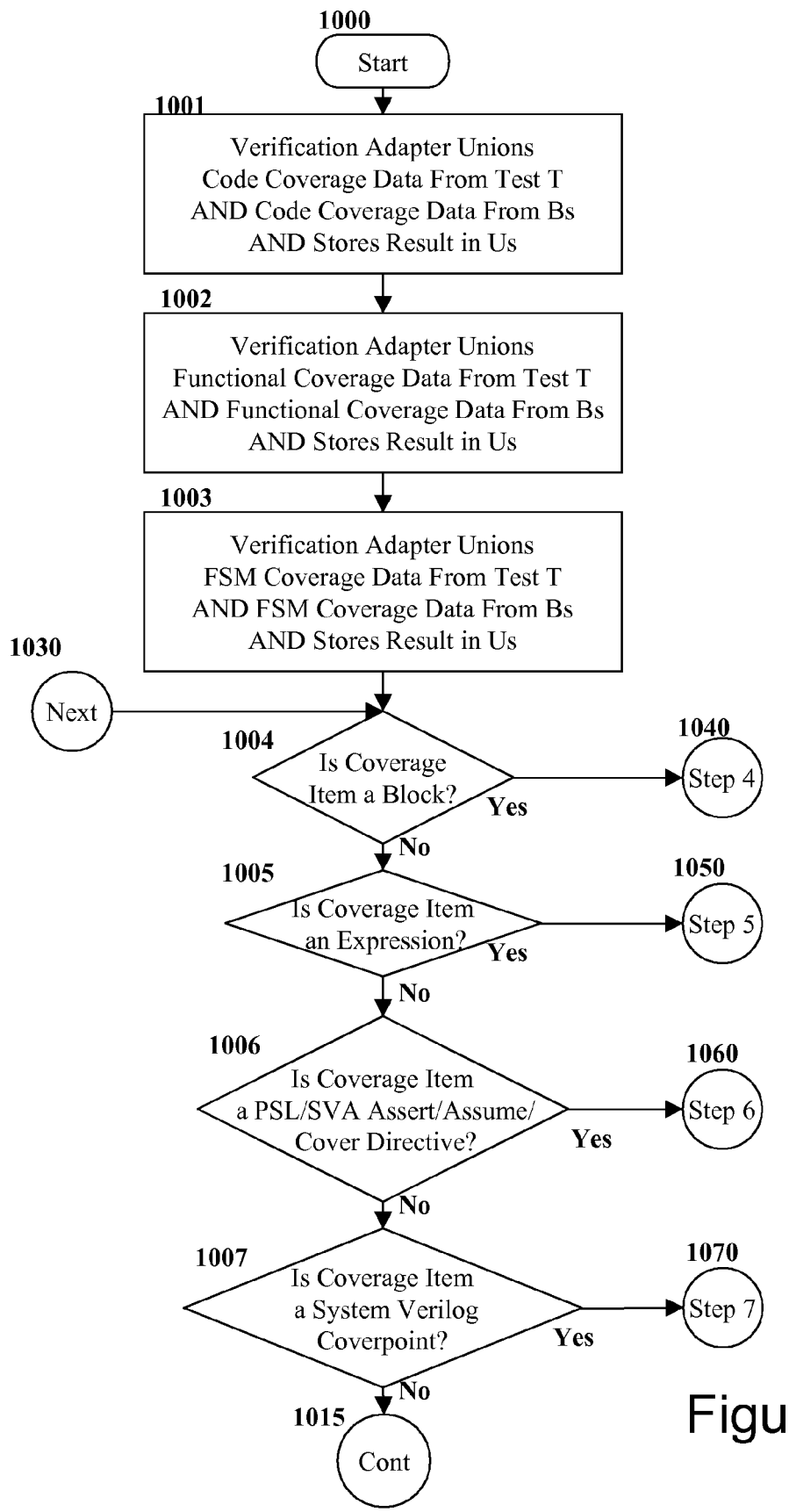
FIGS. 10A-10H illustrate a flow chart of a method for calculation of coverage grade increment for a set of coverage items for a single test T.
Figure 10B:
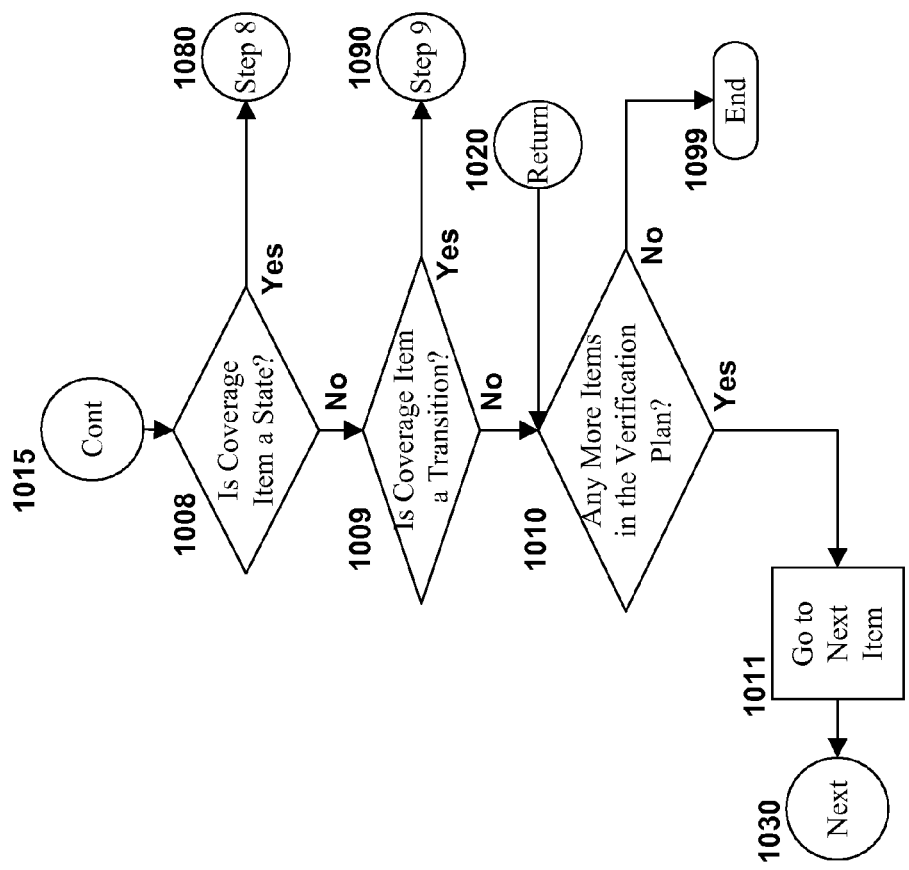
Figure 10C:
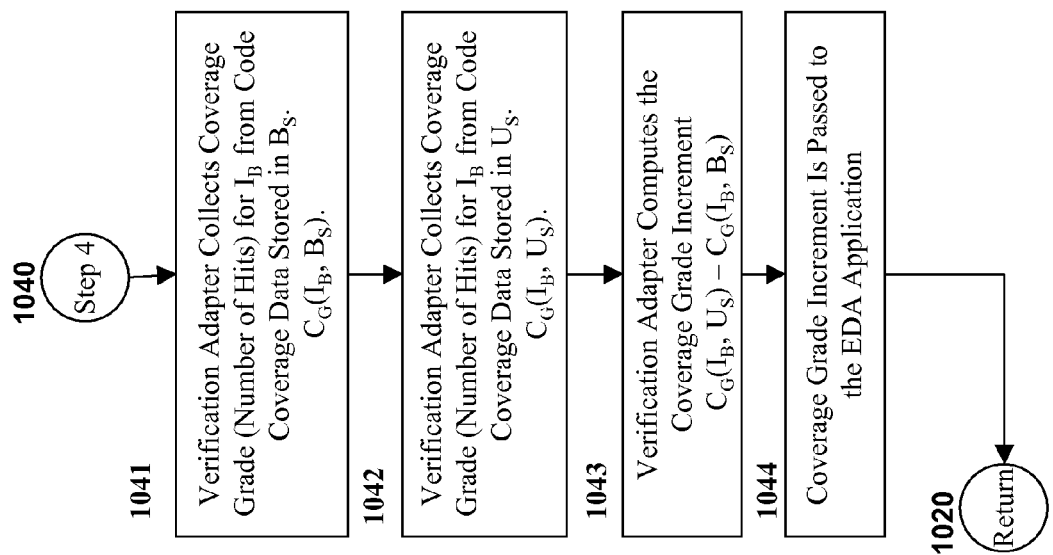
Figure 10D:
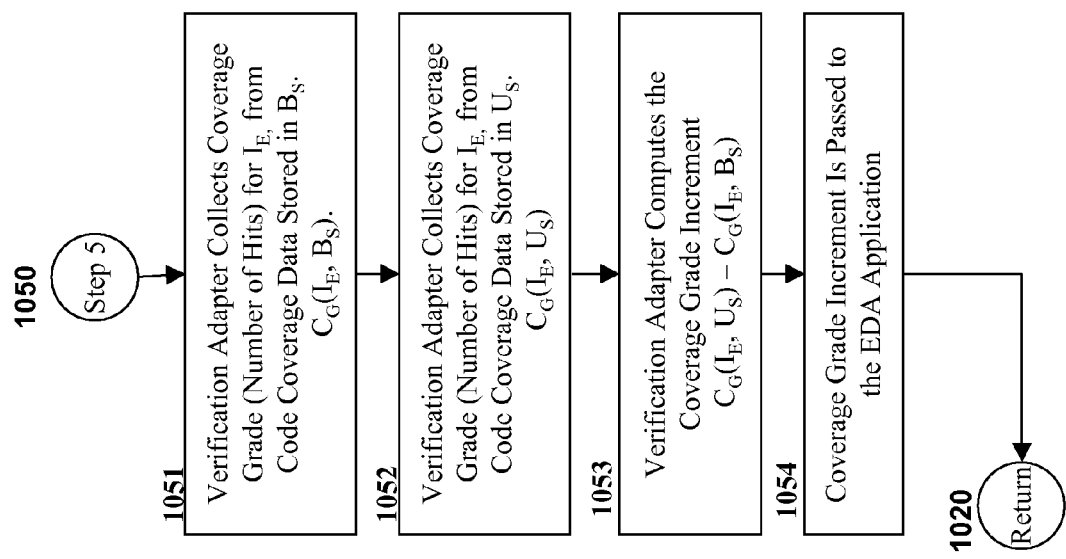
Figure 10E:
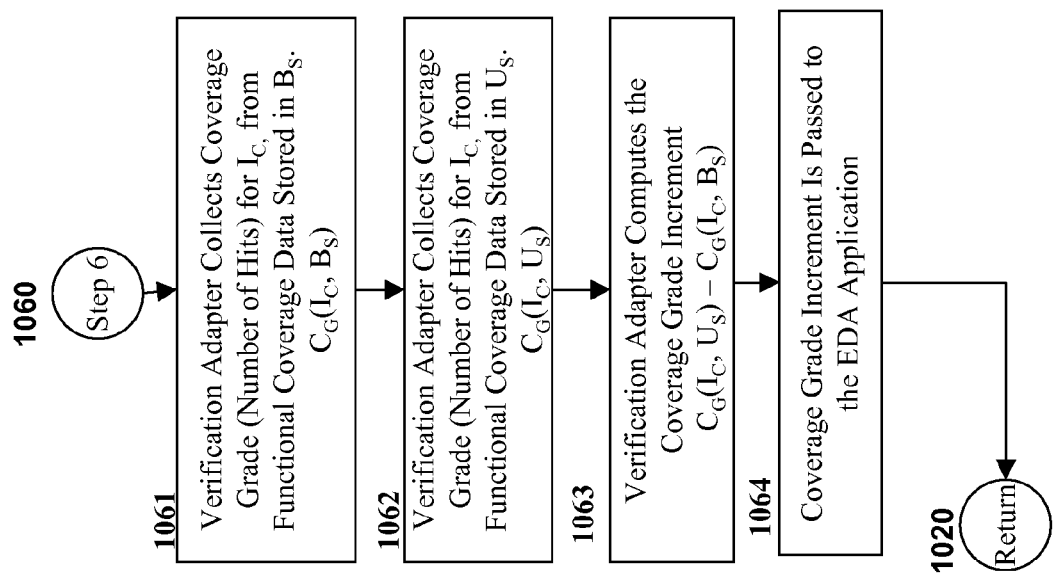
Figure 10F:
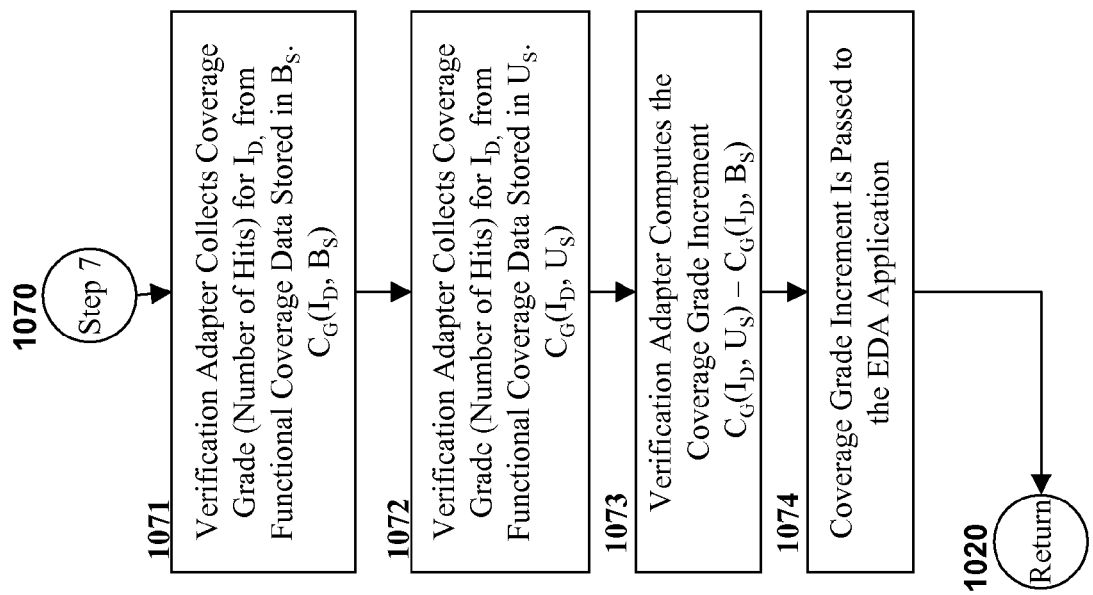
Figure 10G:
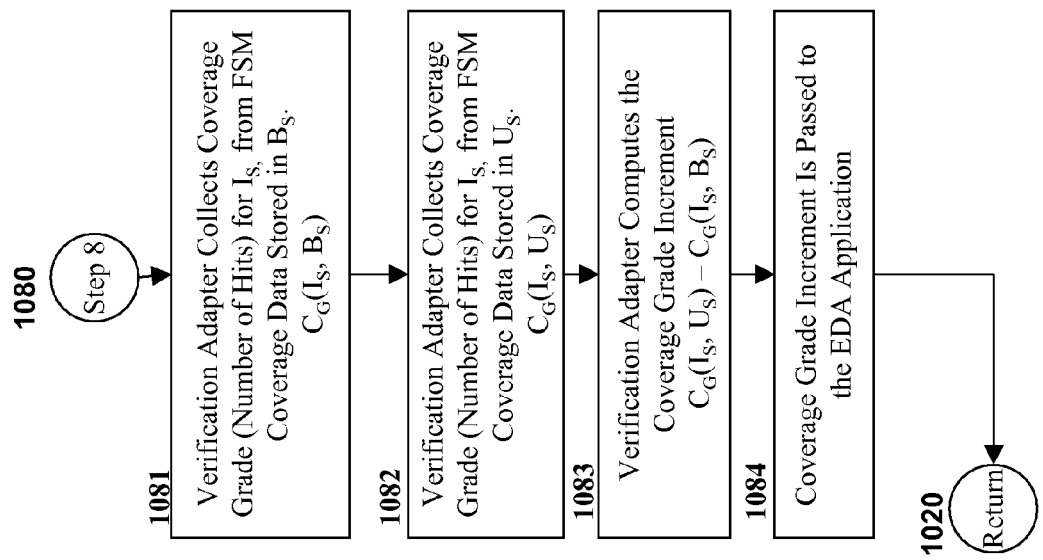
Figure 10H:
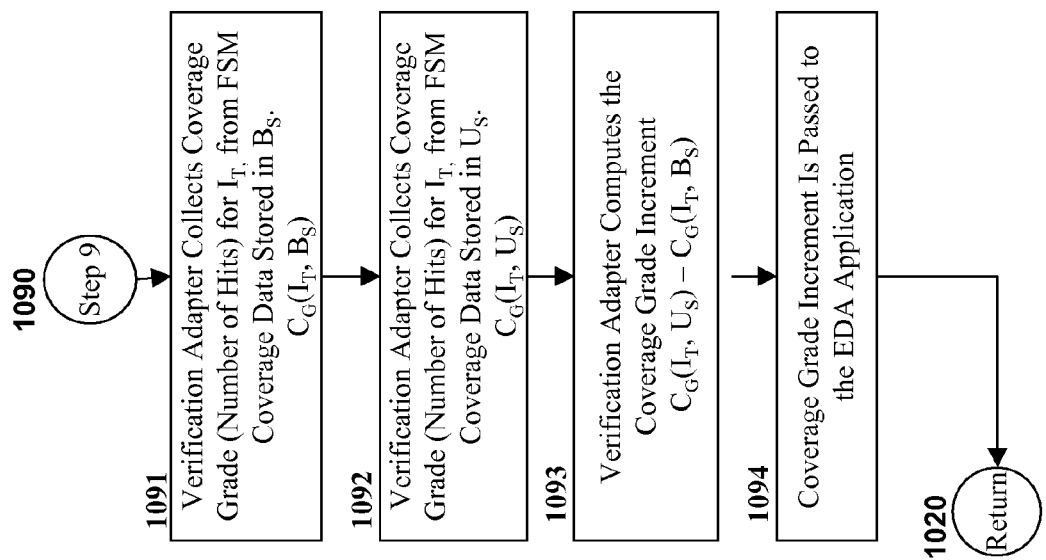

At process 1008 in FIG. 10B, a determination is made if the coverage item is a "state" or not. If the coverage item is a "state", the "Adapter" executes the following steps starting with reference 1080 in FIG. 10G. If the item is not a "state", then the process goes to process 1009.

At process 1081, the "Adapter" collects coverage grade (number of hits) for $I_S$, from FSM coverage data stored in $B_S$. This is denoted as $C_G(I_S, B_S)$ and may be referred to as best test set state coverage grade.

At process 1082, the "Adapter" collects coverage grade (number of hits) for $I_S$, from FSM coverage data stored in $U_S$. This is denoted as $C_G(I_S, U_S)$ and may be referred to as joint state coverage grade.

At process 1083, the "Adapter" computes the coverage grade increment by determining the difference between the joint state coverage grade and the best test set state coverage grade, i.e., $C_G(I_S, U_S)-C_G(I_S, B_S)$.

At process 1084, the state coverage grade increment is passed to the EDA application. The process then returns to reference number 1020 illustrated in FIG. 10A and proceeds to element 1010.

At process 1009, a determination is made if the coverage item is "transition" or not. If the coverage item is "transition", then the "Adapter" executes the following steps starting with reference 1090 in FIG. 10H. If the item is not "transition", then the process goes to process 1010 to determine if there are other items to process.

At process 1091, the "Adapter" collects coverage grade (number of hits) for $I_T$, from FSM coverage data stored in $B_S$. This is denoted as $C_G(I_T, B_S)$ and may be referred to as the best test set transition coverage grade.

At process 1092, the "Adapter" collects coverage grade (number of hits) for $I_T$, from FSM coverage data stored in $U_S$. This is denoted as $C_G(I_T, U_S)$ and may be referred to as joint transition coverage grade.

At process 1093, the "Adapter" computes the transition coverage grade increment by determining the difference between the joint transition coverage grade and the best test set transition coverage grade, i.e., $C_G(I_T, U_S)-C_G(I_T, B_S)$.

At process 1094, the transition coverage grade increment is passed to the EDA application. The process then returns to reference number 1020 illustrated in FIG. 10A and proceeds to element 1010.

Referring to FIG. 10B, after an item is processed through one of the steps 1040, 1050, 1060, 1070, 1080, or 1090 up to reference number 1020, at process 1010 the "Adapter" checks if any item in the verification plan remains to be processed. If an item in the verification plan still needs to be processed, the process goes to process 1011. As shown in process 1011, if the items are present, the "Adapter" proceeds to the next item, as shown in process 1030. Otherwise with no item in the verification plan remaining to be processed, the "Adapter" finishes, as shown in process 1099.

The forgoing processes are repeated for each item in the set of verification plan items passed to the "Adapter" by the EDA application for a particular test T. Note that with each item the necessary design information, required for coverage grade collection, is also passed to the "Adapter". The EDA application calculates the ranking score of test T using these coverage grade increments calculated by the "Adapter" as described above. Based on this ranking score the EDA application decides whether to include T in $B_S$ or mark it as redundant. If the EDA application decides to include it in $B_S$, it updates the content of $B_S$. Otherwise if the test is marked as redundant, $B_S$ content is not updated.

Hence, using the above method provided by the verification Adapter 202 (FIG. 2), the EDA application 204 performs ranking of tests based on all types of coverage namely code, functional and FSM coverage that is available from DUV. In this way, ranking based on total coverage can be achieved.

Operation

Figure 11:
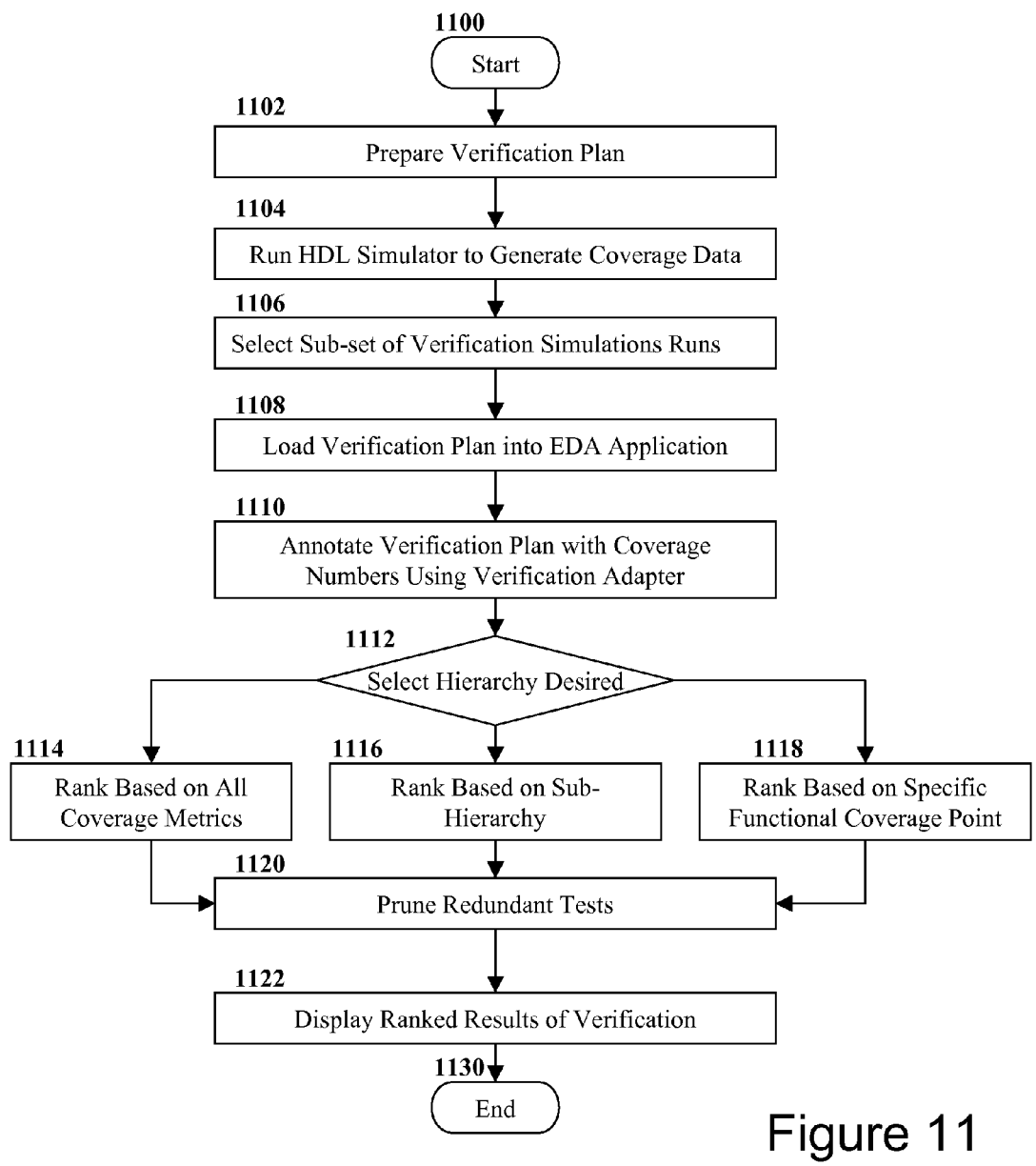
FIG. 11 illustrates a flow chart of an exemplary operation of the verification adapter system.

Referring now to FIGS. 2 and 11, an exemplary operation of the verification system 200 is now described starting at reference 1100.

At process 1102, in a plan-based coverage driven verification methodology, a user first creates the verification plan 201. A sample verification plan is shown in FIGS. 1A-1B. The verification plan 201 may be drafted by the user or generated automatically by software, such as the EDA application 204.

At process 1104, a user runs an HDL simulator to generate coverage data. This run is typically performed through the EDA application 202 supporting the plan-based verification.

Next, at process 1106, the user may select a sub-set of the resulting coverage data, or all coverage data from all the simulation runs for analysis.

At process 1108, a user loads the verification plan 201 into the EDA application 204.

At process 1110, the verification plan 201 is then annotated with the coverage numbers using the verification adapter 202.

Figure 3:
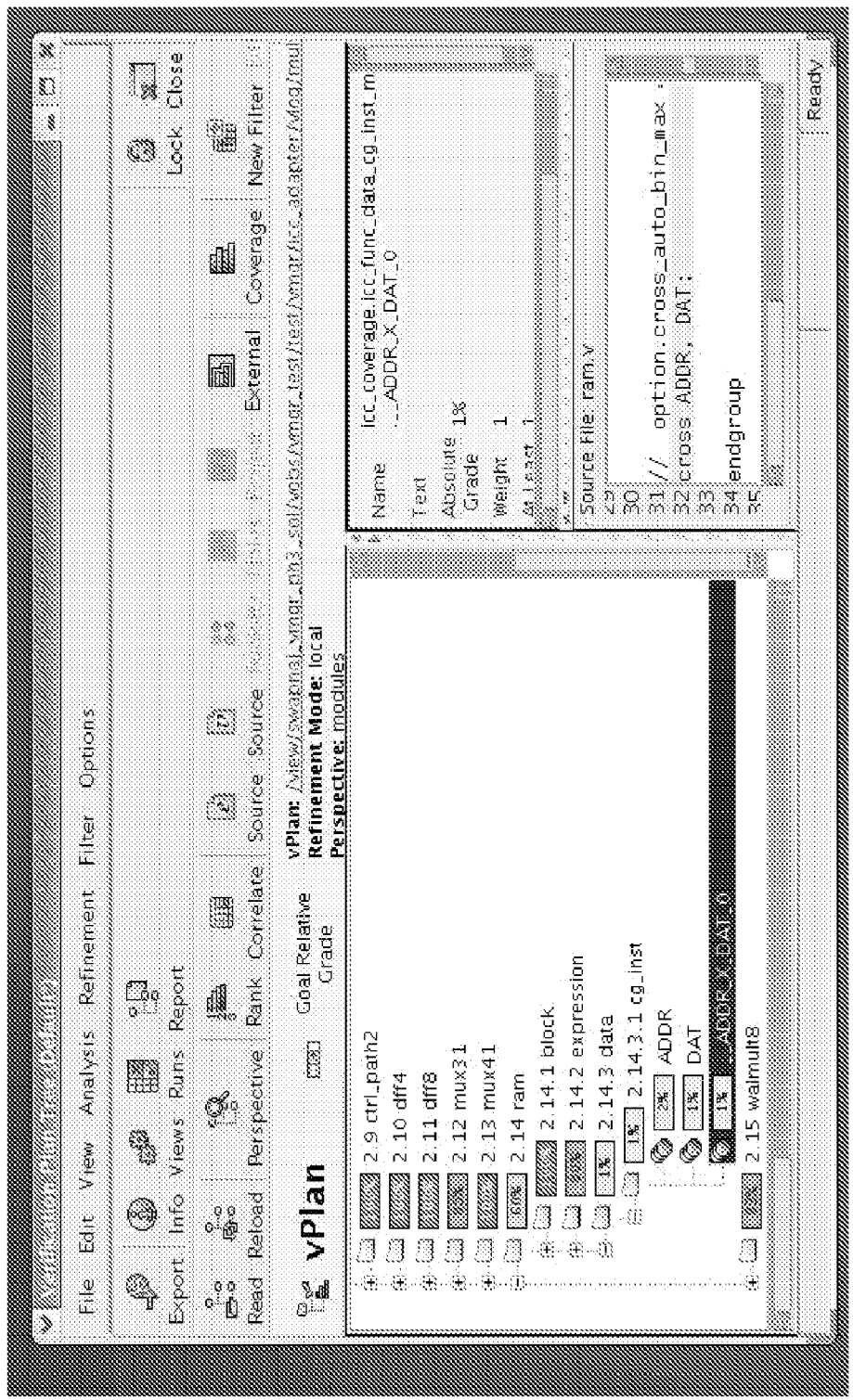
FIG. 3 is a screen shot of an exemplary verification Plan showing code/functional coverage items for a module.
Figure 4:
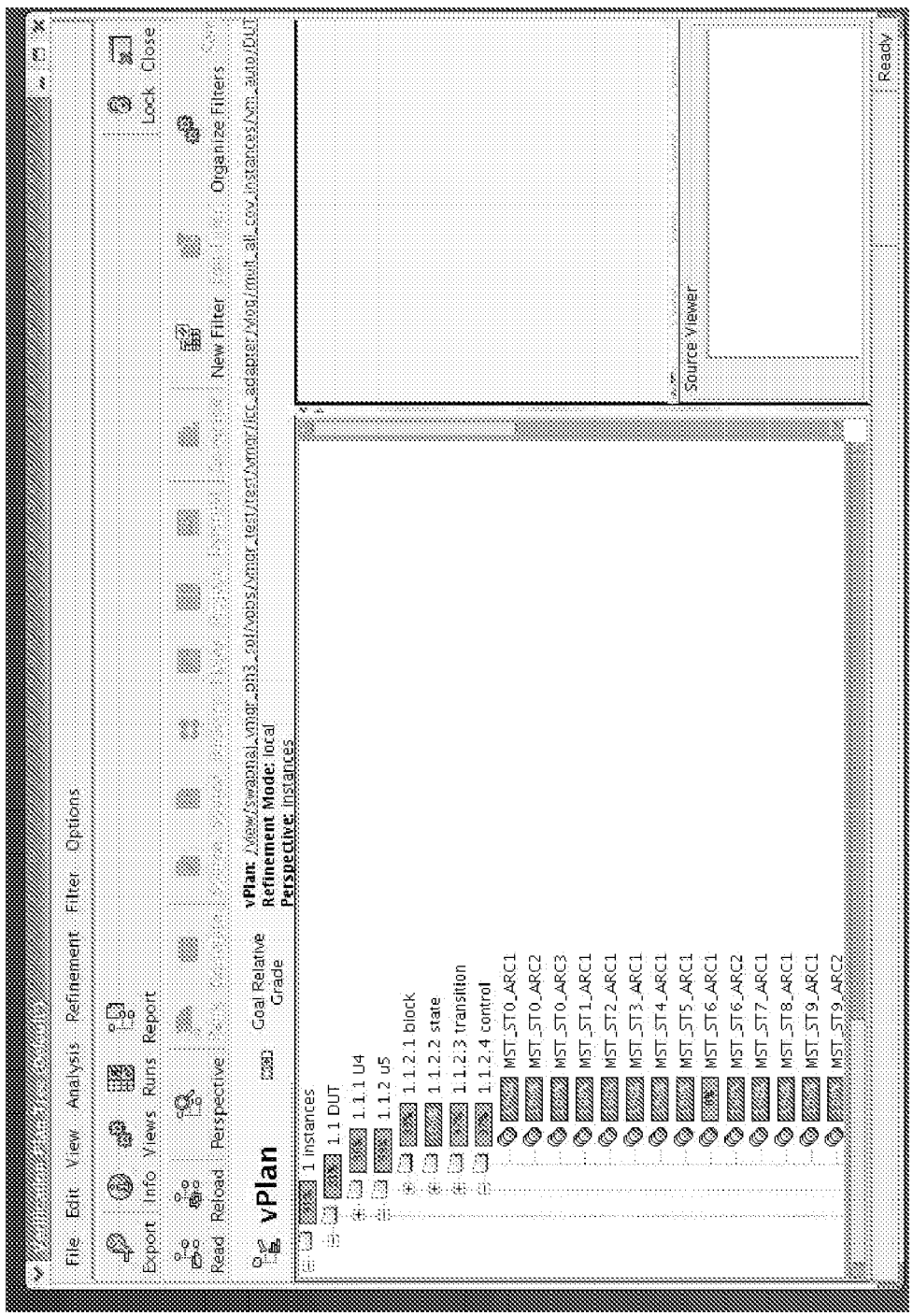
FIG. 4 is a screen shot of an exemplary verification plan showing code/functional coverage items for an instance.
Figure 5:
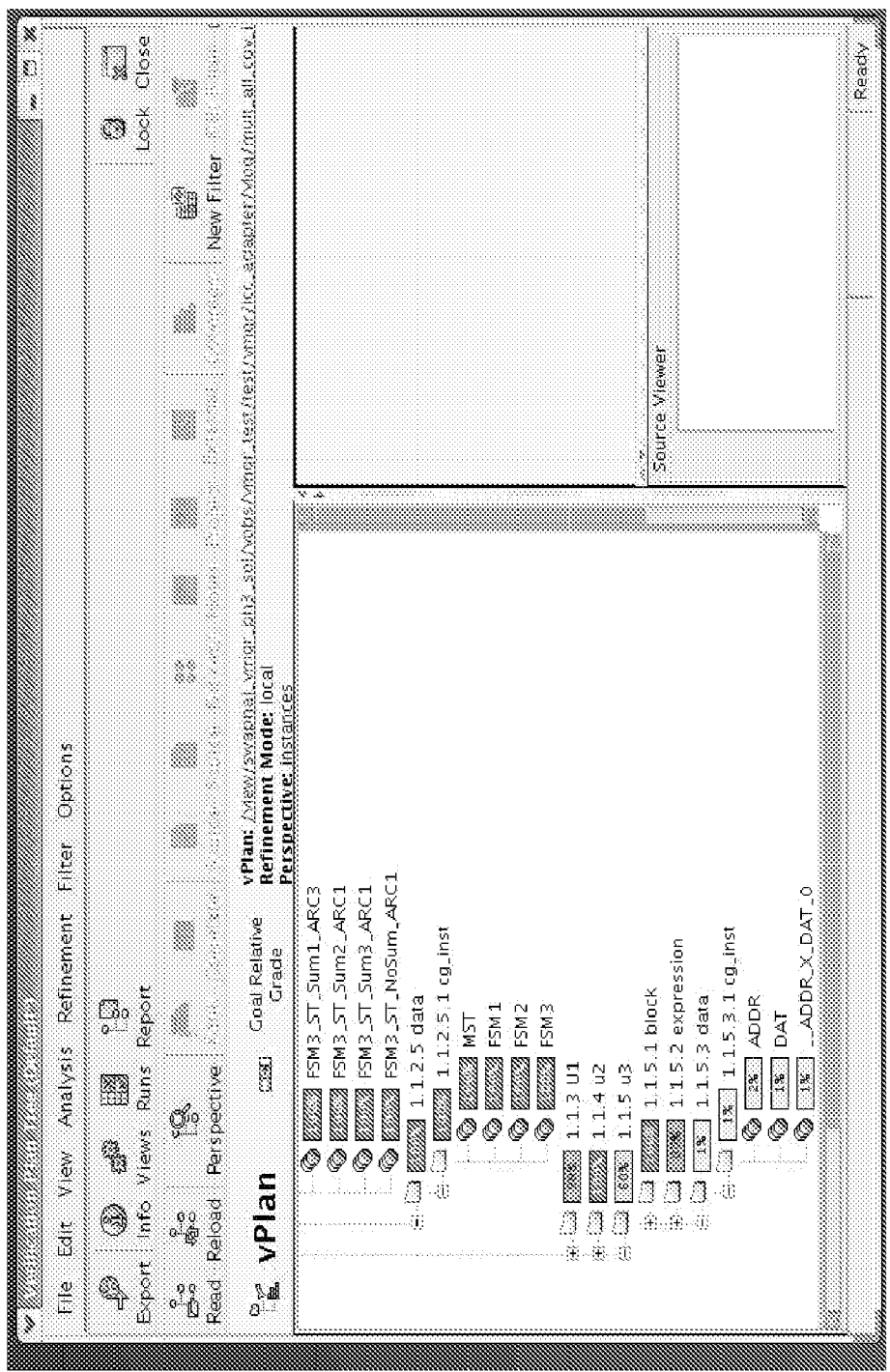
FIG. 5 is a screen shot of an exemplary verification plan showing code/functional coverage items for multiple instances.

FIGS. 3-5 illustrate screenshots of the verification plan 201 annotated with coverage numbers using the verification adapter 202.

FIG. 3 illustrates a screenshot of the verification plan 201 annotated with code or functional coverage items for a module.

FIG. 4 illustrates a screenshot of the verification plan 201 annotated with code or functional coverage items for an instance.

FIG. 5 illustrates a screenshot of the verification plan 201 annotated with code or functional coverage items for multiple instances.

At process 1112, with the coverage numbers annotated to the verification plan 201, as shown in FIGS. 3-5, a user selects a desired item or section hierarchy.

Depending upon the selected level of hierarchy, the ranking of coverage items may be performed based on all coverage metrics, as shown at process 1114; based on a sub-hierarchy, as shown at process 1116; or based on a specific functional coverage point, as shown at process 1118.

Next, at process 1120, the EDA application 204 may prune any redundant tests.

At process 1122, the ranking results are displayed by the EDA application 204, and the process ends with process 1130.

Figure 6:
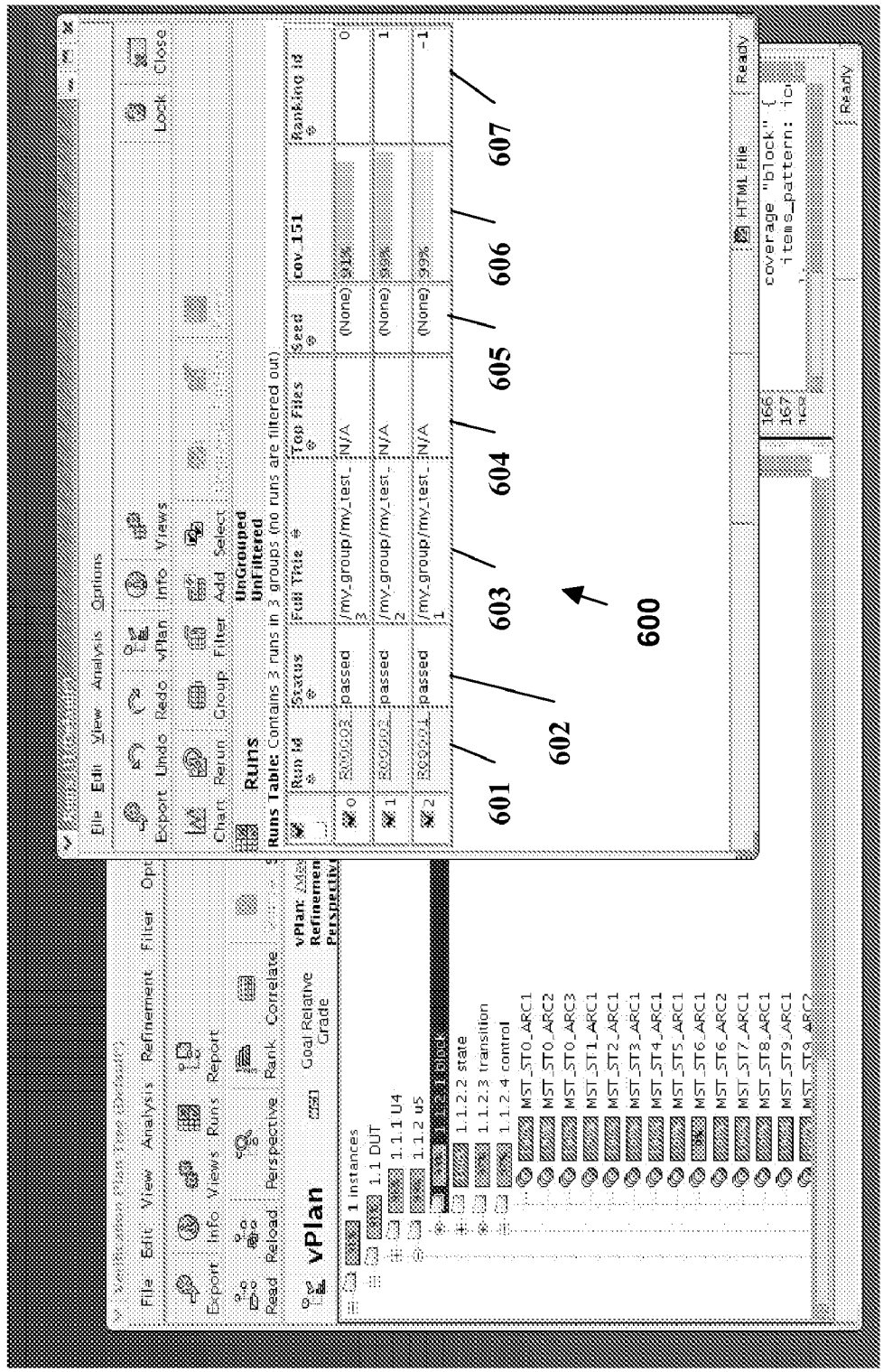
FIG. 6 is a screen shot of an exemplary verification plan showing an item selected to rank tests and the ranking results based on the grade of the coverage item selected in the verification plan.

FIG. 6 shows a result 600 of a ranking based on a particular block coverage item. The result 600 illustrates a run ID 601; a status 602; the full title of the run 603; top file 604, if applicable; seed 605, if applicable; percentage coverage 606; and a ranking identification 607. Runs with a "−1" in ranking id column 607 are redundant runs.

A user can also perform ranking of all runs using total coverage, i.e. combining code, FSM and functional coverage obtained from DUV.

Figure 7:
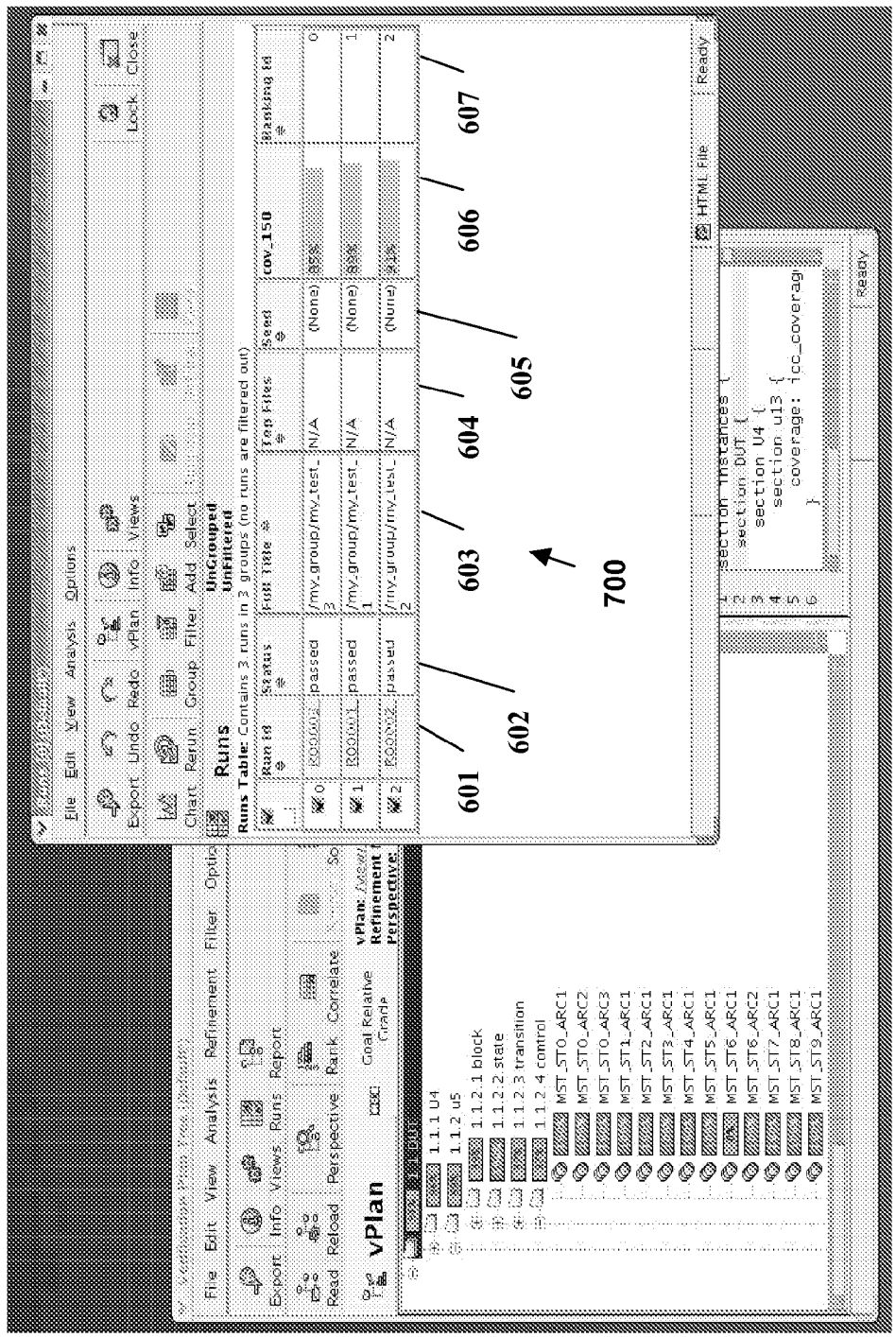
FIG. 7 is a screen shot of an exemplary verification plan showing a section selected for ranking and ranking results.

FIG. 7 shows a ranking result 700 when a user ranks the runs after selecting the top of DUV, or the highest level of hierarchy of the circuit. In this case, a ranking is performed based upon all types of coverage and the verification adapter 202 works with the all the available coverage types. The ranking result 700 illustrates a run ID 601; a status 602; the full title of the run 603; top file 604, if applicable; seed 605, if applicable; percentage coverage 606; and a ranking identification 607.

In some embodiments of the invention, the code, functional and FSM coverage obtained from DUV are represented in a verification plan format. In some embodiments of the invention, the collection of code, functional and FSM coverage from coverage data is generated by an HDL simulator and annotated to the verification plan. In some embodiments of the invention, a method of ranking a set of verification runs is based on total coverage and one or more coverage items from the verification plan.

The verification plan shows coverage items corresponding to code, functional and FSM coverage obtained from the DUV. The verification plan described herein can either be written by the verification engineer or it can be generated automatically. In addition, the ranking method does the ranking based on total coverage which include code, functional and FSM coverage from the DUV. With these features a user can do verification analysis on a DUV based on total coverage. The decision on completeness of verification is also based on total coverage rather than only test-bench coverage. This is very useful in a plan-based CDV methodology.

Figure 12:
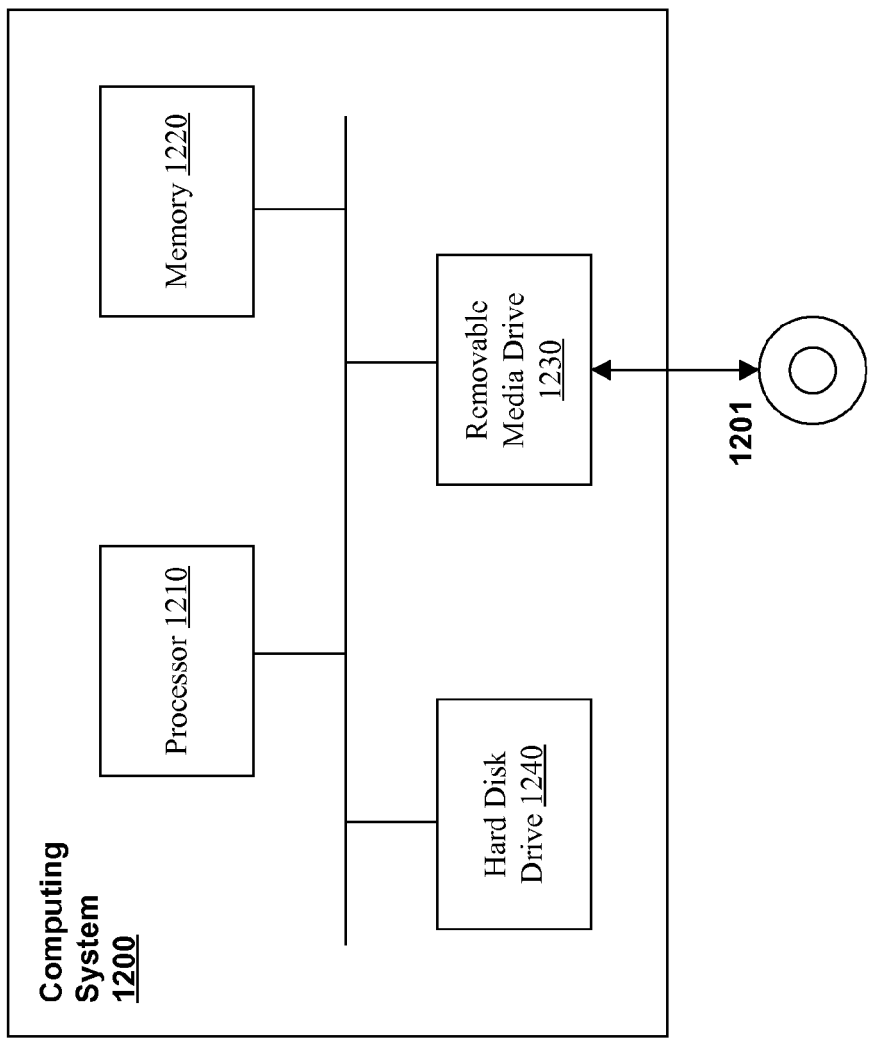
FIG. 12 is a block diagram of an exemplary computer system.

Referring now to FIG. 12, a computing system 1200 is illustrated that may be used to perform some or all of the processes in accordance with a number of embodiments of the invention. In one embodiment of the invention, the computing system 1200 includes a processor 1210, a memory 1220, a removable media drive 1230, and a hard disk drive 1240. In one embodiment, the processor 1210 executes instructions residing on a machine-readable medium, such as the hard disk drive 1240, a removable medium 1201 (e.g., an optical medium (compact disk (CD), digital video disk (DVD), etc.), a magnetic medium (magnetic disk, a magnetic tape, etc.), or a combination of both. The instructions may be loaded from the machine-readable medium into the memory 1220, which may include Random Access Memory (RAM), dynamic RAM (DRAM), etc. The processor 1210 may retrieve the instructions from the memory 1220 and execute the instructions to perform the operations described above.

Note that any or all of the components and the associated hardware illustrated in FIG. 12 may be used in various embodiments of the system 1200. However, it should be appreciated that other configurations of the system 1200 may include more or less devices than those shown in FIG. 12.

Some portions of the preceding detailed description have been presented in terms of algorithms and symbolic representations of operations on data bits within a computer memory. These algorithmic descriptions and representations are the tools used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be kept in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "processing" or "computing" or "calculating" or "determining" or "displaying" or the like, refer to the action and processes of a computer system, or similar electronic computing device, that automatically manipulates and transforms data represented as physical (electronic) quantities within the computer system's registers and memories into other data similarly represented as physical quantities within the computer system memories or registers or other such information storage, transmission or display devices.

The embodiments of the invention also relate to an apparatus for performing the operations described herein. This apparatus may be specially constructed for the required purposes, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The processes and displays presented herein are not inherently related to any particular computer or other apparatus. Various general-purpose systems may be used with programs in accordance with the teachings herein, or it may prove convenient to construct a more specialized apparatus to perform the operations described. The required structure for a variety of these systems will appear from the description below. In addition, the embodiments of the invention are not described with reference to any particular programming language. It will be appreciated that a variety of programming languages may be used to implement the teachings of the invention as described herein.

A machine-readable medium includes any mechanism for storing or transmitting information in a form readable by a machine (e.g., a computer). For example, a machine-readable medium includes read only memory ("ROM"); random access memory ("RAM"); magnetic disk storage media; optical storage media; flash memory devices; electrical, optical, acoustical or other form of propagated signals (e.g., carrier waves, infrared signals, digital signals, etc.); etc.

While certain exemplary embodiments have been described and shown in the accompanying drawings, it is to be understood that such embodiments are merely illustrative of and not restrictive on the broad invention, and that the embodiments of the invention not be limited to the specific constructions and arrangements shown and described, since various other modifications may occur to those ordinarily skilled in the art. Rather the embodiments of the invention should be construed according to the claims that follow below.

What is claimed is:

1. A method comprising:
with a processor,
 generating a plurality of coverage data results for a circuit device by executing a plurality of verification simulation runs;
 obtaining at least a portion of the coverage data results for a plurality of items in the circuit device in response to a verification plan, the verification plan to track verification coverage of a design of the circuit device;
 unionizing the plurality of coverage data results across the plurality of verification simulation runs into unionized coverage data results for the circuit device; and
 providing the unionized coverage data results in response to the verification plan.

2. The method of claim 1, wherein
the plurality of coverage data results includes code coverage data results, functional coverage data results, and finite state machine (FSM) coverage data results.

3. The method of claim 1, further comprising:
automatically generating the verification plan.

4. The method of claim 1, further comprising:
selecting a sub-set of the plurality of verification simulation runs; and
providing coverage data results for the selected sub-set of the plurality of verification simulation runs.

5. The method of claim 1, further comprising:
ranking tests in the verification plan based on the plurality of coverage data results.

6. The method of claim 4, further comprising:
selecting a level of hierarchy in the verification plan to be used in ranking the tests.

7. The method of claim 4, further comprising:

ranking the tests based on a specific functional coverage point.

8. The method of claim 4, further comprising:

pruning redundant runs from the selected sub-set of the plurality of verification simulation runs.

9. The method of claim 1, further comprising:

storing the plurality of coverage data results for the circuit device into a storage; and wherein the at least a portion of the coverage data results is obtained from the storage.

10. The method of claim 1, further comprising:

collecting the unionized coverage data results and annotating the plurality of items of the circuit in the verification plan with the coverage data results.

11. The method of claim 1, wherein the elements of the method are controlled by instructions stored on a computer readable medium and performed by the processor.

12. The method of claim 1, wherein the plurality of coverage data results are stored in a plurality of differing databases.

13. A method comprising:

with a processor, preparing a verification plan for a circuit design, the verification plan to track verification coverage of the circuit design;

executing a logic simulator to generate coverage data results for the circuit design;

annotating the verification plan with coverage numbers to track verification coverage of the circuit design;

selecting a level of hierarchy in the circuit design to rank verification coverage;

ranking tests at the selected level of hierarchy in response to the coverage numbers in the verification plan; and providing the ranked results of the verification plan.

14. The method of claim 13, wherein the coverage data results includes code coverage data results, functional coverage data results, and finite state machine (FSM) coverage data results.

15. The method of claim 13, further comprising:

receiving a user-selection of a sub-set of the plurality of verification simulation runs; and providing coverage data results for the sub-set of the plurality of verification simulation runs.

16. The method of claim 13, further comprising:

pruning redundant items from the verification plan.

* * * * *